(12) United States Patent
Matsukawa

(10) Patent No.: US 11,239,844 B2
(45) Date of Patent: Feb. 1, 2022

(54) OSCILLATOR

(71) Applicant: Seiko Epson Corporation, Toyko (JP)

(72) Inventor: Norihito Matsukawa, Shimosuwa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/171,092

(22) Filed: Feb. 9, 2021

(65) Prior Publication Data

US 2021/0250029 A1 Aug. 12, 2021

(30) Foreign Application Priority Data

Feb. 10, 2020 (JP) .............................. JP2020-020690

(51) Int. Cl.
*H03L 1/04* (2006.01)
*H03L 1/02* (2006.01)
*H03B 5/04* (2006.01)

(52) U.S. Cl.
CPC ................. *H03L 1/04* (2013.01); *H03B 5/04* (2013.01); *H03L 1/022* (2013.01); *H03L 1/028* (2013.01)

(58) Field of Classification Search
CPC ....................................................... H03L 1/04
USPC ......................................................... 331/69
See application file for complete search history.

(56) References Cited

U.S. PATENT DOCUMENTS

| 2011/0133798 | A1 | 6/2011 | Tsukio et al. |
| 2012/0161887 | A1* | 6/2012 | Ito .............................. H03L 1/04 331/70 |
| 2017/0019111 | A1 | 1/2017 | Yorita |
| 2019/0058478 | A1* | 2/2019 | Fry .......................... H03B 5/32 |

FOREIGN PATENT DOCUMENTS

| JP | 2015-201840 A | 11/2015 |
| JP | 2016-111522 A | 6/2016 |
| JP | 2017-028360 A | 2/2017 |
| WO | 2010023883 A1 | 3/2010 |

\* cited by examiner

*Primary Examiner* — Joseph Chang
(74) *Attorney, Agent, or Firm* — Harness, Dickey & Pierce, P.L.C.

(57) ABSTRACT

An oscillator includes: a resonator; a heat generation circuit configured to heat the resonator; a temperature sensor positioned closer to the heat generation circuit than the resonator is and configured to output a temperature detection signal; a temperature control circuit configured to output a temperature control signal for controlling a temperature of the heat generation circuit based on the temperature detection signal; an oscillation clock signal output circuit configured to oscillate the resonator and output an oscillation clock signal; and a correction circuit configured to correct a frequency variation of the oscillation clock signal, in which the correction circuit is configured to compensate for a transient frequency variation of the oscillation clock signal based on a time change amount of the temperature detection signal or a time change amount of the temperature control signal.

9 Claims, 11 Drawing Sheets

OSCILLATOR

The present application is based on, and claims priority from JP Application Serial Number 2020-020690, filed Feb. 10, 2020, the disclosure of which is hereby incorporated by reference herein in its entirety.

BACKGROUND

1. Technical Field

The present disclosure relates to an oscillator.

2. Related Art

As an oscillator for obtaining a highly accurate oscillation output, an oven controlled crystal oscillator (OCXO) including an oscillation circuit, a quartz crystal resonator, a heater, and a temperature detector in one tank is known. In the oven controlled crystal oscillator, the heater is coupled to an input terminal for inputting a power supply voltage of the oven controlled crystal oscillator, and the temperature detector detects a temperature in the tank of the oven controlled crystal oscillator. The temperature in the tank is controlled to be constant by controlling a current flowing through the heater according to a detected value of the temperature detector. Accordingly, a temperature of the resonator such as the quartz crystal resonator is stabilized, and a frequency output from the resonator is stabilized.

JP-A-2017-028360 discloses a technique of an oscillator in which an oscillation unit is disposed on a thin bottom portion of a package, a heat generation element is disposed on a thick bottom portion, and a vibration element is mounted on the heat generation element, and a heat conductive portion that thermally couples the thin bottom portion and the thick bottom portion is included, thereby reducing a temperature change of the oscillation unit and reducing an oscillation frequency change due to a temperature characteristic of the oscillation element included in the oscillation unit.

However, in the oscillator as disclosed in JP-A-2017-028360, for example, when a power supply voltage applied to the heat generation element varies, a current consumption in the heat generation element may vary, and as a result, a heat generation amount in the heat generation element may vary. When the heat generation amount in the heat generation element varies thus, a transient temperature variation occurs in a resonator in a period until a temperature is stabilized by temperature control in the oscillator. Accordingly, a frequency output from the resonator temporarily varies, and as a result, frequency accuracy of an oscillation signal output from the oven controlled crystal oscillator may reduce.

SUMMARY

According to one aspect of the present disclosure, an oscillator includes: a resonator; a heat generation circuit configured to heat the resonator; a temperature sensor positioned closer to the heat generation circuit than the resonator is and configured to output a temperature detection signal; a temperature control circuit configured to output a temperature control signal for controlling a temperature of the heat generation circuit based on the temperature detection signal; an oscillation clock signal output circuit configured to oscillate the resonator and output an oscillation clock signal; and a correction circuit configured to correct a frequency variation of the oscillation clock signal, in which the correction circuit is configured to compensate for a transient frequency variation of the oscillation clock signal based on a time change amount of the temperature detection signal or a time change amount of the temperature control signal.

DESCRIPTION OF EXEMPLARY EMBODIMENTS

Hereinafter, preferred embodiments of the present disclosure will be described in detail with reference to the drawings. The embodiments described below do not in any way limit contents of the present disclosure described in the appended claims. Not all configurations described below are necessarily essential components of the present disclosure.

1. First Embodiment

1.1 Structure of Oscillator

Figure 1:
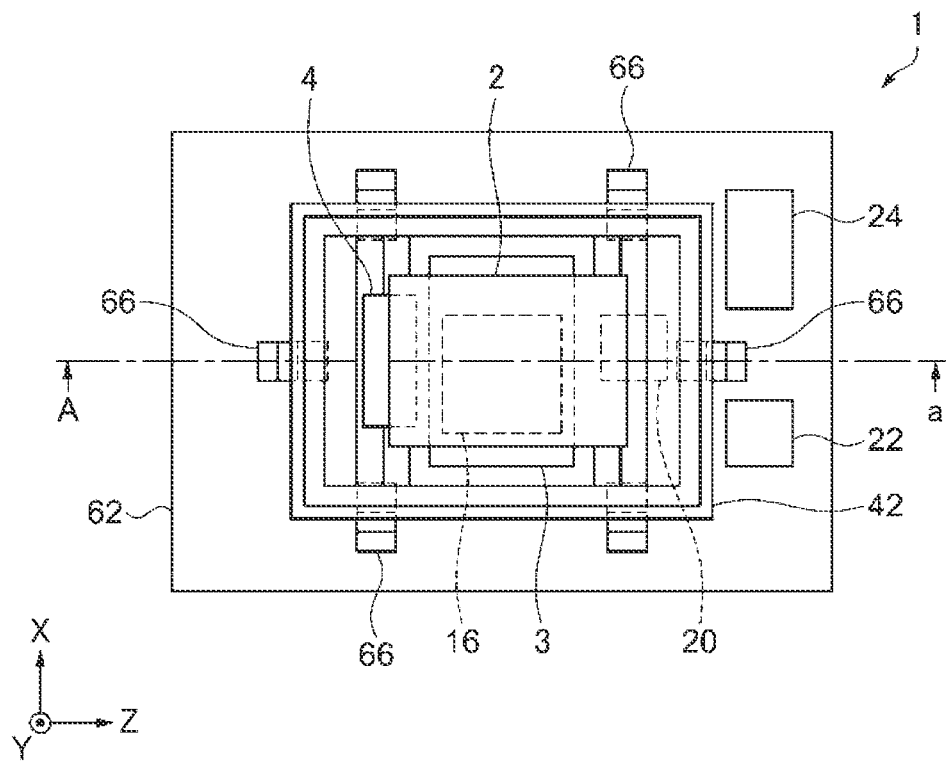
FIG. 1 is a plan view showing an example of a structure of an oscillator.
Figure 2:
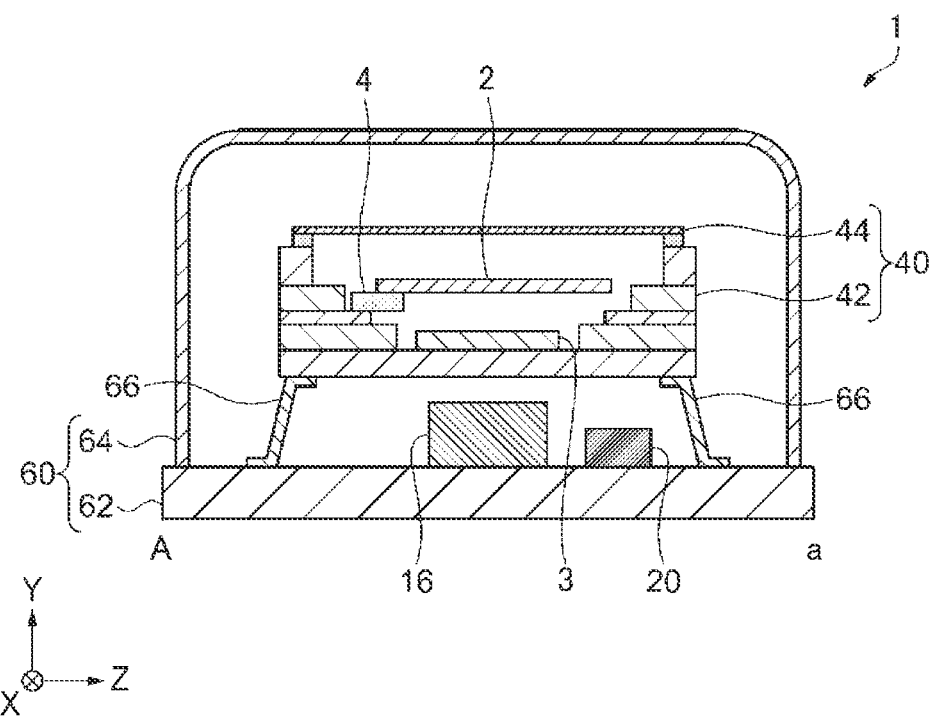
FIG. 2 is a sectional view taken along a line A-a in FIG. 1.
Figure 3:
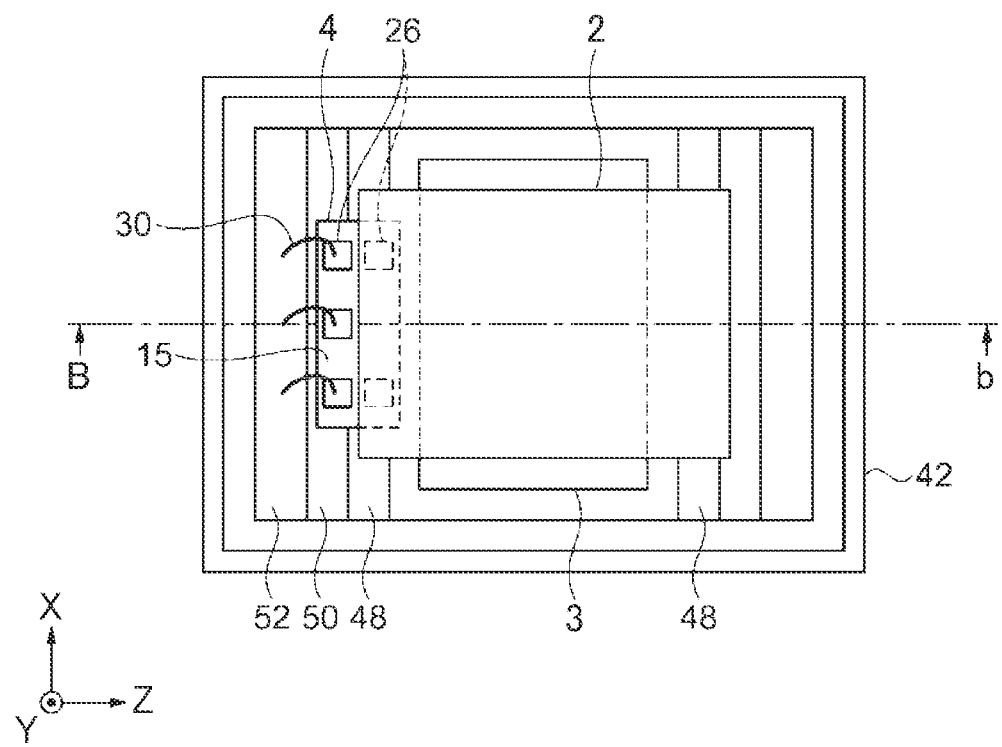
FIG. 3 is a plan view showing an example of a structure of a container forming the oscillator.
Figure 4:
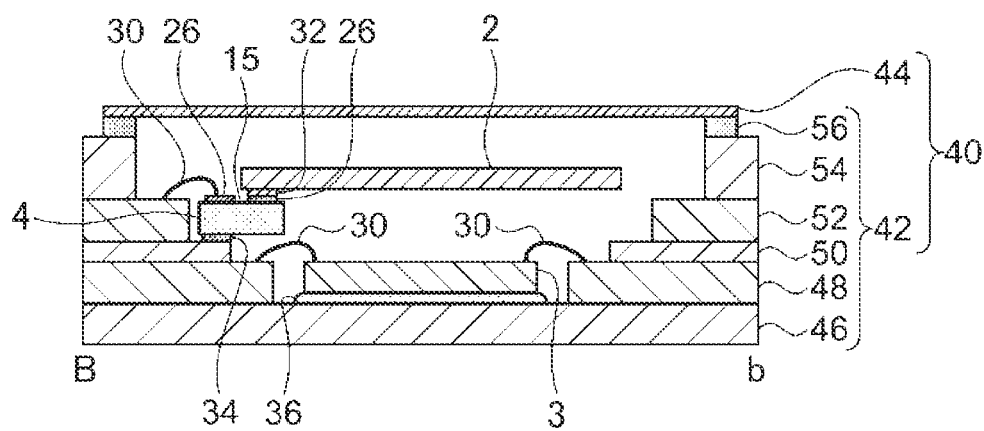
FIG. 4 is a sectional view taken along a line B-b in FIG. 3.

A structure of an oscillator 1 will be described with reference to FIGS. 1 to 4. The oscillator 1 in the first embodiment is an oven controlled crystal oscillator (OCXO). FIG. 1 is a plan view showing an example of the structure of the oscillator 1. FIG. 2 is a sectional view taken along a line A-a in FIG. 1. FIG. 3 is a plan view showing an example of a structure of a container 40 forming the oscillator 1. FIG. 4 is a sectional view taken along a line B-b in FIG. 3. In FIGS. 1 and 3, for convenience of describing an internal structure of the oscillator 1 and the container 40, a state in which a cover 64 and a lid member 44 are removed is shown. In the following description, an X-axis, a Y-axis, and a Z-axis are used as three axes orthogonal to each other. In this case, a tip end side of the X-axis shown is referred to as a +X side, an origin side of the X-axis is referred to as a −X side, a tip end side of the Y-axis shown is referred to as a +Y side, an origin side of the Y-axis is referred to as a −Y side, a tip end side of the Z-axis shown is referred to as a +Z side, and an origin side of the Z-axis is referred to as a −Z side. Further, in the following description, a view from the +Y side along the Y-axis may be referred to as a plan view, and in the plan view, a surface on the +Y side may be referred to as an upper surface, and a surface on the −Y side may be referred to as a lower surface. Wiring patterns and electrode pads formed on an upper surface of a base substrate 62, coupling terminals formed on an outer surface of the container 40, and wiring patterns and electrode pads formed inside the container 40 are omitted.

As shown in FIGS. 1 and 2, the oscillator 1 includes the container 40 accommodating therein a resonator 2, a first circuit device 3 including an oscillation circuit and a second circuit device 4 including a temperature control circuit, and a circuit element 16 disposed on the upper surface of the base substrate 62 and outside the container 40. The resonator 2 may be, for example, an SC cut quartz crystal resonator having a small external stress sensitivity and excellent frequency stability.

On the upper surface of the base substrate 62 of the oscillator 1, the container 40 is disposed separately from the base substrate 62 via lead frames 66, and circuit components 20, 22, and 24 such as a plurality of capacitors and resistors are disposed. Further, the container 40 and the circuit element 16 are covered with the cover 64 and accommodated in a container 60. An inside of the container 60 is hermetically sealed in a decompressed atmosphere such as vacuum or an inert gas atmosphere such as nitrogen, argon or helium.

As described above, in the oscillator 1 according to the first embodiment, the circuit element 16 and the circuit components 20, 22, and 24 for adjusting the oscillation circuit and the like included in the resonator 2 or the first circuit device 3 are disposed outside the container 40. Therefore, due to heat of a heat generation circuit included in the second circuit device 4 accommodated in the container 40, a possibility of gas occurring from a resin member constituting the circuit element 16, a solder, a conductive adhesive, and the like, which are coupling members coupling the circuit element 16 and the circuit components 20, 22, 24 to the container 40 is reduced. Even if the gas occurs, since the resonator 2 is accommodated in the container 40, a possibility that the resonator 2 is affected by the gas is reduced, and as a result, the resonator 2 maintains stable frequency characteristics. That is, it is possible to obtain an oscillator 1 having high frequency stability.

As shown in FIGS. 3 and 4, the first circuit device 3, the second circuit device 4, and the resonator 2 are accommodated inside the container 40. The resonator 2 is disposed on an upper surface of the second circuit device 4. An inside of the container 40 is hermetically sealed in a decompressed atmosphere such as vacuum or an inert gas atmosphere such as nitrogen, argon or helium.

The container 40 includes a package body 42 and the lid member 44. As shown in FIG. 4, the package body 42 includes a first substrate 46, a second substrate 48, a third substrate 50, a fourth substrate 52, and a fifth substrate 54 that are stacked. The second substrate 48, the third substrate 50, the fourth substrate 52, and the fifth substrate 54 are annular bodies from which central portions are removed, and a sealing member 56 such as a seal ring or a low melting point glass is formed on a peripheral edge of an upper surface of the fifth substrate 54. The second substrate 48 and the third substrate 50 form a recess in which the first circuit device 3 is accommodated, and the fourth substrate 52 and the fifth substrate 54 form a recess that accommodates the second circuit device 4 and the resonator 2.

The first circuit device 3 is joined to a predetermined position on an upper surface of the first substrate 46 by a joining member 36. The first circuit device 3 is electrically coupled to an electrode pad (not shown) disposed on an upper surface of the second substrate 48 by a bonding wire 30.

The second circuit device 4 is joined to a predetermined position on an upper surface of the third substrate 50 by a joining member 34. An electrode pad 26 is provided on an active surface 15 which is the upper surface of the second circuit device 4. The electrode pad 26 provided in the second circuit device 4 is electrically coupled to an electrode pad (not shown) disposed on an upper surface of the fourth substrate 52 by a bonding wire 30.

As described above, the first circuit device 3 and the second circuit device 4 are disposed apart from each other in the container 40. Therefore, the heat of the second circuit device 4 occurred in order to heat the resonator 2 is less likely to be transmitted directly to the first circuit device 3, and as a result, a possibility that the heat occurred in the second circuit device 4 contributes to the first circuit device 3 is reduced, and a possibility that characteristics of the oscillation circuit included in the first circuit device 3 deteriorate due to overheating of the second circuit device 4 is reduced.

The resonator 2 is disposed on the active surface 15 of the second circuit device 4. That is, the second circuit device 4 is positioned closer to the resonator 2 than the first circuit device 3 is. Specifically, the resonator 2 is joined to the second circuit device 4 via a joining member 32 such as a metal bump or a conductive adhesive that electrically couples the electrode pad 26 formed on the active surface 15 of the second circuit device 4 and an electrode pad (not shown) formed on a lower surface of the resonator 2. In other words, the resonator 2 is supported by the second circuit device 4. Each of excitation electrodes (not shown) provided on upper and lower surfaces of the resonator 2 is electrically coupled to the electrode pad (not shown) formed on the lower surface of the resonator 2. The resonator 2 and the second circuit device 4 may be coupled such that the heat generated in the second circuit device 4 is transmitted to the resonator 2. Therefore, for example, the resonator 2 and the second circuit device 4 may be coupled by a non-conductive joining member, and the resonator 2 and the second circuit device 4 or the package body 42 may be electrically coupled using a conductive member such as a bonding wire (not shown).

As described above, since the resonator 2 is disposed on the second circuit device 4, the oscillator 1 can efficiently transmit the heat occurred in the second circuit device 4 to the resonator 2, and as a result, temperature control of the resonator 2 can be stabilized at low consumption.

In FIG. 1, although a shape of the resonator 2 is shown as a rectangular shape in the plan view, the shape of the resonator 2 is not limited to the rectangular shape, and may be, for example, a circular shape. The resonator 2 is not limited to the SC cut quartz crystal resonator, and may be an AT cut quartz crystal resonator, or may be a piezoelectric resonator such as a tuning fork type quartz crystal resonator or a surface acoustic wave resonant piece, or a micro electro mechanical systems (MEMS) resonant element. When the AT cut quartz crystal resonator is used as the resonator 2, a B-mode voltage reduction circuit is not necessary, so that a size of the oscillator 1 can be reduced.

1.2 Electrical Configuration of Oscillator

Figure 5:
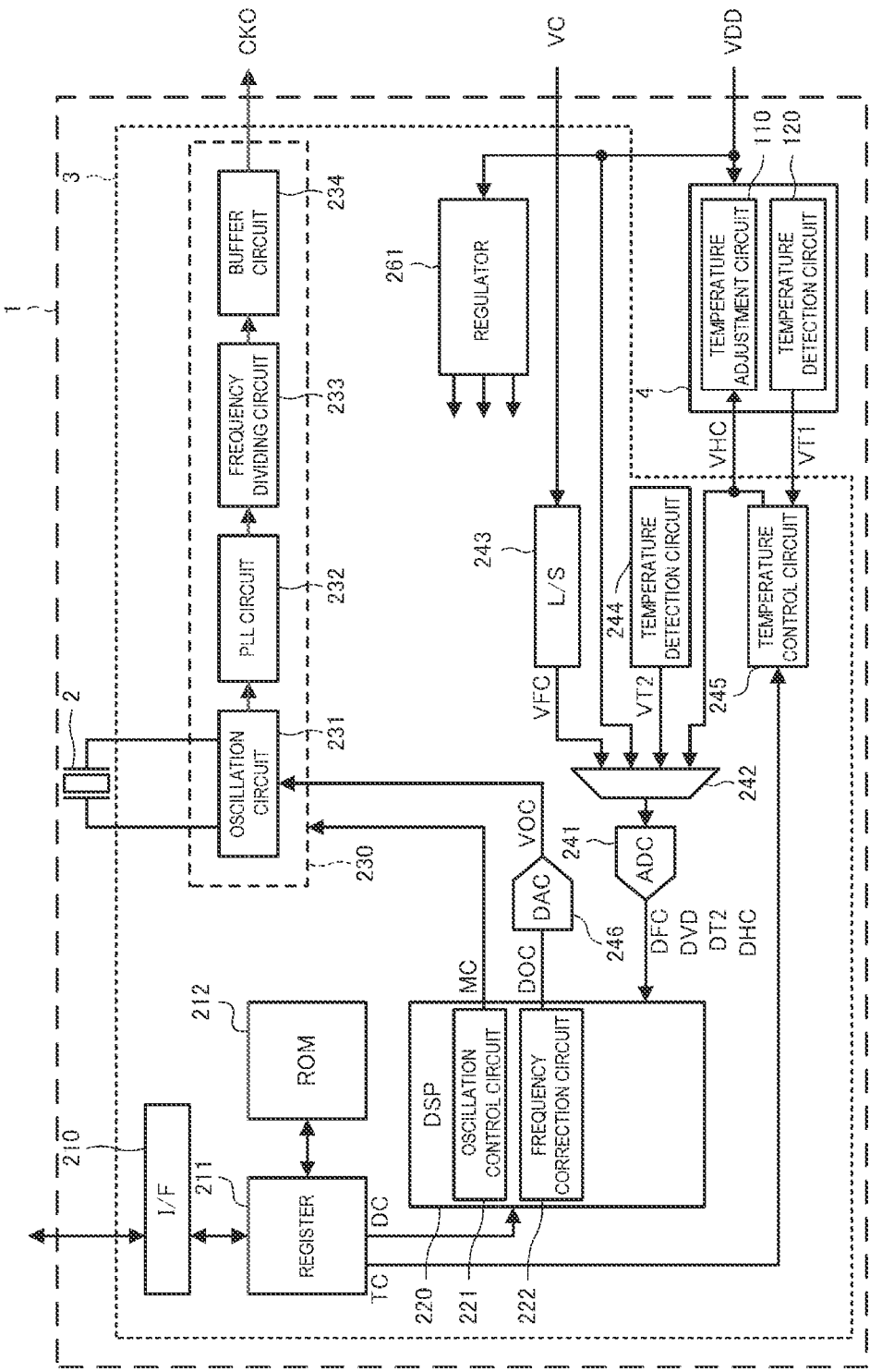
FIG. 5 is a functional block diagram showing an electrical configuration of the oscillator.

FIG. 5 is a functional block diagram showing an electrical configuration of the oscillator 1 according to the first embodiment. As shown in FIG. 5, the oscillator 1 according to the first embodiment includes the resonator 2, the first circuit device 3, and the second circuit device 4.

The second circuit device 4 includes a temperature adjustment circuit 110 and a temperature detection circuit 120. Here, the second circuit device 4 in the first embodiment including the temperature adjustment circuit 110 and the temperature detection circuit 120 is integrally formed as an integrated circuit. In other words, the oscillator 1 includes an integrated circuit including the temperature adjustment circuit 110 and the temperature detection circuit 120 as the second circuit device 4. The second circuit device 4 formed as the integrated circuit is an example of the first integrated circuit.

The temperature adjustment circuit 110 includes a heat generation element that is an element for adjusting a temperature of the resonator 2. Heat generated by the temperature adjustment circuit 110 is controlled by a temperature control signal VHC supplied from the first circuit device 3. As described above, the resonator 2 is joined to the second circuit device 4. Therefore, the heat generated by the temperature adjustment circuit 110 is transmitted to the resonator 2. That is, the temperature of the resonator 2 can be brought close to a desired temperature by controlling the heat generated from the temperature adjustment circuit 110. That is, the temperature adjustment circuit 110 heats the resonator 2. The temperature adjustment circuit 110 for heating the resonator 2 is an example of the heat generation circuit.

The temperature detection circuit 120 detects a temperature, and outputs a first temperature detection signal VT1 of a voltage level according to the detected temperature to the first circuit device 3. As described above, the resonator 2 is joined to the second circuit device 4. That is, the temperature detection circuit 120 included in the second circuit device 4 is positioned in a vicinity of the resonator 2. Therefore, the temperature detection circuit 120 can detect an ambient temperature of the resonator 2. The temperature adjustment circuit 110 and the temperature detection circuit 120 are integrally formed with the second circuit device 4 which is the integrated circuit. Therefore, the temperature detection circuit 120 is also positioned in a vicinity of the temperature adjustment circuit 110. That is, the temperature detection circuit 120 detects an ambient temperature of the temperature adjustment circuit 110. As described above, the temperature detection circuit 120 detects the ambient temperature of the resonator 2 and the ambient temperature of the temperature adjustment circuit 110. Here, the first temperature detection signal VT1 is an example of the temperature detection signal, and the temperature detection circuit 120 that outputs the first temperature detection signal VT1 is an example of the temperature sensor.

The first circuit device 3 includes an interface (I/F) circuit 210, a register 211, a ROM 212, a digital signal processor (DSP) 220, an oscillation clock signal output circuit 230, an analog to digital (A/D) converter (ADC) 241, a selector 242, a level shifter (L/S) 243, a temperature detection circuit 244, a temperature control circuit 245, a digital to analog (D/A) converter (DAC) 246, and a regulator 261.

The interface circuit 210 performs data communication with an external device (not shown) coupled to the oscillator 1. The interface circuit 210 may be, for example, a circuit corresponding to an inter-integrated circuit ($I^2C$) bus or a circuit corresponding to a serial peripheral interface (SPI) bus.

The register 211 and the ROM 212 store various kinds of information of the oscillator 1. The register 211 includes a volatile memory, and the ROM 212 includes a nonvolatile memory. In an inspection process or the like at the time of manufacturing the oscillator 1, the external device writes various kinds of data for controlling an operation of each circuit included in the oscillator 1 to the register 211 via the interface circuit 210, thereby adjusting each circuit included in the oscillator 1. Then, the external device stores optimum data of the various kinds of adjustment values determined by the adjustment in the ROM 212 via the interface circuit 210. Thereafter, when the oscillator 1 is powered on, various kinds of data stored in the ROM 212 are transferred to and held in the register 211. Then, various kinds of data held in the register 211 is supplied to each circuit.

The regulator 261 boosts or lowers a voltage value of a power supply voltage VDD supplied from the outside of the first circuit device 3, thereby generating an operating voltage for operating each circuit included in the first circuit device 3 and a reference potential of each circuit included in the first circuit device 3.

The temperature control circuit 245 generates the temperature control signal VHC for controlling the temperature of the temperature adjustment circuit 110 based on a temperature setting value TC of the resonator 2 input from the register 211 and the first temperature detection signal VT1 detected by the temperature detection circuit 120. That is, the temperature control circuit 245 outputs the temperature control signal VHC for controlling the temperature of the temperature adjustment circuit 110 based on the first temperature detection signal VT1 output from the temperature detection circuit 120. Here, the temperature control signal VHC is an example of the temperature control signal, and the temperature control circuit 245 that outputs the temperature control signal VHC is an example of the temperature control circuit.

The temperature setting value TC output from the register 211 may be a setting value of a target temperature of the resonator 2, and may be stored in a predetermined storage area of the ROM 212. When the oscillator 1 is powered on, the temperature setting value TC stored in the ROM 212 is read and transferred to and held in a predetermined storage area included in the register 211. Thereafter, the temperature setting value TC held in the predetermined storage area included in the register 211 is supplied to the temperature control circuit 245.

The level shifter 243 converts a frequency control signal VC supplied from the outside of the oscillator 1 to a desired voltage level, thereby generating a frequency control signal VFC.

The temperature detection circuit 244 detects the temperature, and outputs a second temperature detection signal VT2 of a voltage level according to the detected temperature. As described above, the first circuit device 3 is joined to the upper surface of the first substrate 46. That is, the first circuit device 3 is provided at a position farther from the resonator 2 than the second circuit device 4 is. In other words, the temperature detection circuit 244 included in the first circuit device 3 is provided at a position farther from the resonator 2 or the temperature adjustment circuit 110 than the temperature detection circuit 120 is. Then, the temperature detection circuit 244 detects an internal temperature of the container 40 at a position farther from the resonator 2 or the temperature adjustment circuit 110.

The frequency control signal VFC generated by the level shifter 243, the temperature control signal VHC generated by the temperature control circuit 245, the second temperature detection signal VT2 generated by the temperature detection circuit 244, and the power supply voltage VDD supplied to the oscillator 1 are input to the selector 242. Then, the selector 242 selects and outputs any one of the frequency control signal VFC, the temperature control signal VHC, the second temperature detection signal VT2, and the power supply voltage VDD. In the first embodiment, the selector 242 selects and outputs the frequency control signal VFC, the temperature control signal VHC, the second temperature detection signal VT2, and the power supply voltage VDD in time division.

The A/D converter 241 respectively converts the frequency control signal VFC, the temperature control signal VHC, the second temperature detection signal VT2, and the power supply voltage VDD output from the selector 242 in the time division into a frequency control code DFC, a temperature control code DHC, a second temperature detection code DT2, and a power supply voltage code DVD, which are digital signals in sequence.

The digital signal processor 220 includes an oscillation control circuit 221 and a frequency correction circuit 222. A setting signal DC output from the register 211 and the frequency control code DFC, the temperature control code DHC, the second temperature detection code DT2, and the power supply voltage code DVD output from the A/D converter 241 are input to the digital signal processor 220.

The oscillation control circuit 221 generates an oscillation control signal MC for controlling an operation of the oscillation clock signal output circuit 230 based on the setting signal DC input from the register 211. The oscillation control signal MC is input to the oscillation clock signal output circuit 230 to be described later. According to the oscillation control signal MC, various kinds of setting values of the oscillation clock signal output circuit 230 such as a multiplication rate of a PLL circuit 232, a division ratio of a frequency dividing circuit 233, and a buffering period of a buffer circuit 234 included in the oscillation clock signal output circuit 230 are changed. That is, the oscillation control circuit 221 controls the operation of the oscillation clock signal output circuit 230. The oscillation control circuit 221 is an example of a control circuit.

The frequency correction circuit 222 outputs a frequency correction code DOC for correcting a frequency of an oscillation clock signal CKO output by the oscillation clock signal output circuit 230 based on the frequency control code DFC, the temperature control code DHC, the second temperature detection code DT2, and the power supply voltage code DVD. With respect to a signal for performing control based on the second temperature detection code DT2 such that the frequency of the oscillation clock signal CKO output by the oscillation clock signal output circuit 230 becomes a desired frequency, the frequency correction circuit 222 in the first embodiment generates the frequency correction code DOC for correcting the frequency of the oscillation clock signal CKO by compensating for a transient frequency variation of the oscillation clock signal CKO based on a time change amount of the temperature control code DHC according to the temperature control signal VHC. Details of the frequency correction circuit 222 will be described later.

The D/A converter 246 converts the frequency correction code DOC generated by the frequency correction circuit 222 included in the digital signal processor 220 into a frequency correction signal VOC, which is an analog signal, and outputs the frequency correction signal VOC to the oscillation clock signal output circuit 230.

The oscillation clock signal output circuit 230 includes an oscillation circuit 231, a PLL circuit 232, a frequency dividing circuit 233, and a buffer circuit 234.

The oscillation circuit 231 is electrically coupled to both ends of the resonator 2, amplifies an output signal of the resonator 2, and feeds back the amplified signal to the resonator 2 to oscillate the resonator 2. The oscillation circuit 231 may be, for example, a circuit using an inverter as an amplification element, or may be a circuit using a bipolar transistor as an amplification element. The oscillation circuit 231 in the first embodiment oscillates the resonator 2 at a frequency according to a voltage value of the frequency correction signal VOC supplied from the D/A converter 246. Specifically, the oscillation circuit 231 includes a variable capacitor element (not shown) serving as a load capacitor of the resonator 2. When a voltage according to the frequency correction signal VOC is applied to the variable capacitor element, a magnitude of the load capacitor of the variable capacitor element becomes a value according to the voltage. That is, the magnitude of the load capacitor of the variable capacitor element of the oscillation circuit 231 is controlled by the voltage value according to the frequency correction signal VOC, so that a frequency of an oscillation signal output from the oscillation circuit 231 is corrected.

The PLL circuit 232 multiplies a frequency of an oscillation signal output from the oscillation circuit 231.

The frequency dividing circuit 233 divides the oscillation signal output from the PLL circuit 232.

The buffer circuit 234 buffers the oscillation signal output from the frequency dividing circuit 233 and outputs the buffered oscillation signal to the outside of the first circuit device 3 as the oscillation clock signal CKO. The oscillation clock signal CKO becomes an output signal of the oscillator 1.

Here, the first circuit device 3 in the first embodiment is formed as an integrated circuit. In other words, the oscillator 1 includes an integrated circuit including the oscillation clock signal output circuit 230 and the frequency correction circuit 222 as the first circuit device 3. The first circuit device 3 formed as the integrated circuit is an example of the second integrated circuit. The oscillation clock signal output circuit 230 that causes the resonator 2 to oscillate and outputs the oscillation clock signal CKO is an example of the oscillation clock signal output circuit, and the frequency correction circuit 222 that corrects a frequency variation of the oscillation clock signal CKO is an example of the correction circuit.

1.3 Configurations of Temperature Adjustment Circuit 110 and Temperature Detection Circuit 120

Next, a specific configuration example of the temperature adjustment circuit 110 and the temperature detection circuit 120 included in the second circuit device 4 will be described with reference to FIGS. 6 and 7.

Figure 6:
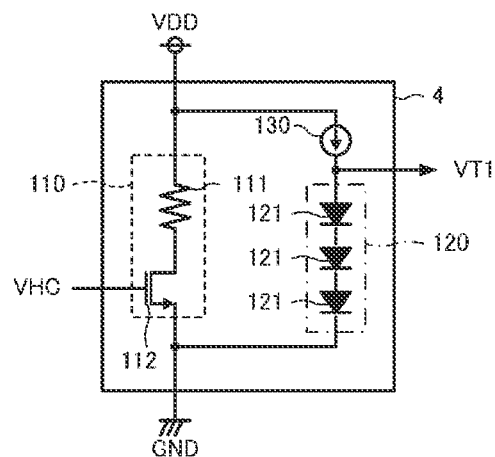
FIG. 6 is a diagram showing a specific configuration example of a second circuit device.

FIG. 6 is a diagram showing a specific configuration example of the second circuit device 4. As shown in FIG. 6, the temperature adjustment circuit 110 included in the second circuit device 4 includes a resistor 111 and a MOS transistor 112 coupled in series between the power supply voltage VDD and a ground GND. The temperature control signal VHC is input to a gate of the MOS transistor 112. The MOS transistor 112 is controlled by the temperature control signal VHC, and as a result, a current flowing through the resistor 111 is controlled. Accordingly, a heat generation amount of the resistor 111 is controlled.

The temperature detection circuit 120 included in the second circuit device 4 is formed such that one or a plurality of diodes 121 are coupled in series in a forward direction between the power supply voltage VDD and the ground GND. A constant current source 130 supplies a constant current to the temperature detection circuit 120. That is, a constant current in the forward direction flows through the one or the plurality of diodes 121. When the constant current in the forward direction flows through the diode 121, a voltage across the diode 121 changes approximately linearly with respect to a temperature change. Therefore, a voltage on an anode side of the diode 121 changes linearly with respect to the temperature. Therefore, the signal generated at an anode of the diode 121 can be used as the first temperature detection signal VT1.

Figure 7:
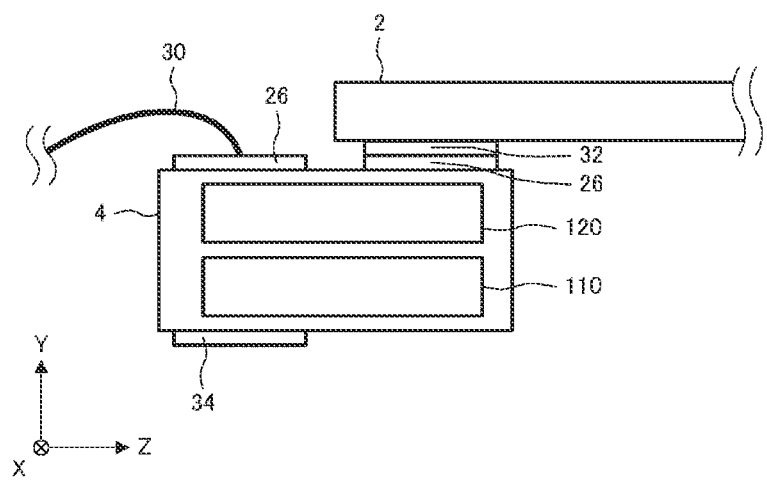
FIG. 7 is a diagram showing a structure example of the second circuit device formed as an integrated circuit.

FIG. 7 is a diagram showing a structure example of the second circuit device 4 formed as an integrated circuit. As shown in FIG. 7, in the second circuit device 4 integrally formed as the integrated circuit, the temperature adjustment circuit 110 and the temperature detection circuit 120 are stacked in a direction along the Y-axis. As described above, the resonator 2 is positioned above the second circuit device 4 integrally formed as the integrated circuit in the direction along the Y-axis that is a direction in which the temperature adjustment circuit 110 and the temperature detection circuit 120 are stacked.

Specifically, the temperature adjustment circuit 110 is positioned on a −Y side inside the second circuit device 4 integrally formed as the integrated circuit, and the temperature detection circuit 120 is stacked on a +Y side of the temperature adjustment circuit 110 inside the second circuit device 4 integrally formed as the integrated circuit. The resonator 2 is joined to the second circuit device 4 integrally formed as the integrated circuit above a +Y side of the second circuit device 4 via the electrode pad 26 and the joining member 32. That is, the temperature detection circuit 120 is positioned above the temperature adjustment circuit 110 and closer to the resonator 2 than the temperature adjustment circuit 110 is.

Accordingly, if the temperature of the temperature adjustment circuit 110 varies, the temperature detection circuit 120 can detect the temperature variation before the changed temperature is transmitted to the resonator 2. By correcting an oscillation frequency of the resonator 2 by the first circuit device 3 with respect to the temperature variation detected by the temperature detection circuit 120, it is possible to reduce a possibility that the oscillation frequency of the resonator 2 varies due to the temperature change.

1.4 Configuration and Operation of Frequency Correction Circuit

Figure 8:
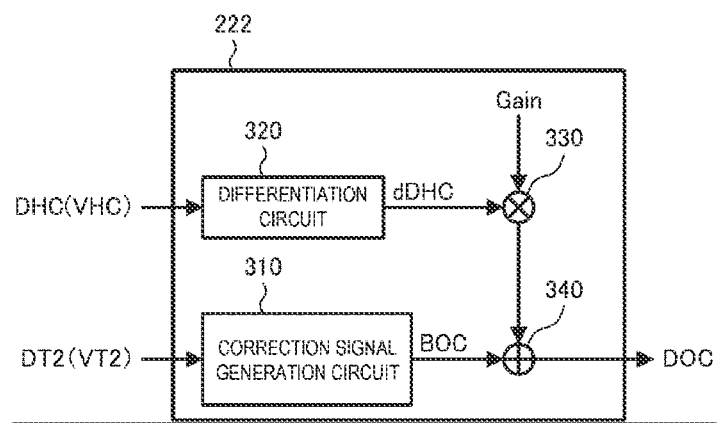
FIG. 8 is a diagram showing an example of a configuration of a frequency correction circuit.

Next, a configuration and an operation of the frequency correction circuit 222 that reduces a frequency variation of the oscillator 1 will be described. FIG. 8 is a diagram showing an example of the configuration of the frequency correction circuit 222. As shown in FIG. 8, the frequency correction circuit 222 includes a correction signal generation circuit 310, a differentiation circuit 320, a multiplier 330, and an adder 340.

The correction signal generation circuit 310 corrects the frequency of the oscillation clock signal CKO output from the oscillation clock signal output circuit 230 based on the second temperature detection code DT2 according to the second temperature detection signal VT2. In the first embodiment, the correction signal generation circuit 310 outputs, based on the second temperature detection code DT2, a base frequency correction code BOC, which is a digital signal for temperature compensation so that the frequency of the oscillation clock signal CKO becomes the desired frequency. Specifically, in the inspection process at the time of manufacturing the oscillator 1, the correction signal generation circuit 310 generates temperature compensation data for generating a temperature compensation value that is substantially opposite to frequency-temperature characteristics of the resonator 2. The generated temperature compensation data is stored in the ROM 212. When the oscillator 1 is powered on, the temperature compensation data is transferred from the ROM 212 to a predetermined storage area included in the register 211 and held therein. Based on the temperature compensation data and the second temperature detection code DT2, the correction signal generation circuit 310 generates the base frequency correction code BOC for correcting the frequency of the oscillation clock signal CKO output from the oscillation clock signal output circuit 230. In addition to the temperature compensation data and the second temperature detection code DT2, the correction signal generation circuit 310 may generate the base frequency correction code BOC using the frequency control code DFC according to the frequency control signal VFC.

The temperature control code DHC according to the temperature control signal VHC generated by the temperature control circuit 245 is input to the differentiation circuit 320. The differentiation circuit 320 differentiates the temperature control code DHC to generate a differential temperature control code dDHC indicating the time change amount of the temperature control code DHC.

Here, as described above, the temperature control signal VHC is a signal for controlling the temperature adjustment circuit 110. Therefore, for example, when the temperature of the temperature adjustment circuit 110 is higher than a predetermined temperature, the temperature control signal VHC includes information for lowering the temperature of the temperature adjustment circuit 110, and when the temperature of the temperature adjustment circuit 110 is lower than a predetermined temperature, the temperature control signal VHC includes information for raising the temperature of the temperature adjustment circuit 110. That is, the temperature control signal VHC is a signal according to the temperature of the temperature adjustment circuit 110 and changes in conjunction with a temperature change of the temperature adjustment circuit 110. Therefore, the differential temperature control code dDHC output from the differentiation circuit 320 is a signal indicating a time change amount of the temperature of the temperature adjustment circuit 110. That is, when a transient temperature change occurs in the temperature adjustment circuit 110, the differentiation circuit 320 outputs the differential temperature control code dDHC.

In the first embodiment, whether a transient temperature change occurs in the temperature adjustment circuit 110 is detected by the differentiation circuit 320, but any configuration may be used as long as it can detect whether a transient temperature change occurs in the temperature adjustment circuit 110. For example, a high-pass filter circuit or a band-pass filter circuit may be used instead of the differentiation circuit 320.

The multiplier 330 multiplies the differential temperature control code dDHC output from the differentiation circuit 320 by a predetermined gain Gain.

The adder 340 adds a signal obtained by multiplying the differential temperature control code dDHC by the predetermined gain Gain and the base frequency correction code BOC output from the correction signal generation circuit 310, and outputs the frequency correction code DOC.

When a transient temperature change occurs in the temperature adjustment circuit 110, the differential temperature control code dDHC is added to the frequency correction code DOC output from the frequency correction circuit 222 configured as described above. That is, the frequency correction circuit 222 compensates for the transient frequency variation of the oscillation clock signal CKO based on a time change amount of the temperature control signal VHC. Accordingly, when the transient temperature change occurs in the temperature adjustment circuit 110, correction accuracy of the frequency of the oscillation clock signal CKO output from the oscillation clock signal output circuit 230 can be improved. That is, when a short-term variation occurs in the temperature of the temperature adjustment circuit 110, the frequency variation of the oscillation clock signal CKO output from the oscillator 1 can be reduced regardless of a cause of the variation.

1.5 Action and Effect

In the oscillator 1 configured as described above, the frequency correction circuit 222 that corrects the frequency variation of the oscillation clock signal CKO compensates for the frequency variation of the oscillation clock signal CKO based on the time change amount of the temperature control signal VHC for controlling the temperature of the temperature adjustment circuit 110 generated based on the temperature of the temperature adjustment circuit 110 detected by the temperature detection circuit 120. That is, the frequency correction circuit 222 corrects the frequency variation of the oscillation clock signal CKO based on the temperature change of the temperature adjustment circuit 110 that heats the resonator 2. Therefore, the frequency correction circuit 222 can compensate for the transient frequency variation occurring in the oscillation clock signal CKO regardless of a cause of the temperature change in the temperature adjustment circuit 110 that heats the resonator 2. Here, in the present embodiment, the transient frequency variation means the frequency variation in a period after a temporary temperature variation occurs in the oscillator 1 until a temperature of the oscillator 1 is controlled by the temperature adjustment circuit 110 and the frequency of the oscillation clock signal CKO output from the oscillator 1 is stabilized within a desired frequency range, and includes, for example, a sharp variation in the frequency of the oscillation clock signal CKO occurred in a short time in the period until the frequency of the oscillation clock signal CKO is stabilized within the desired frequency range.

Figure 9:
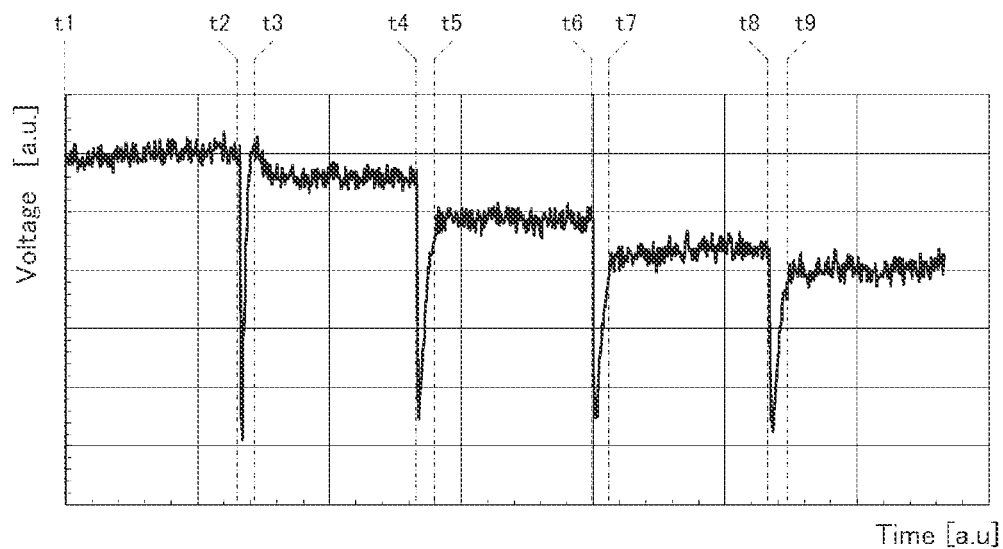
FIG. 9 is a diagram showing an example of a time variation occurring in a voltage value of a temperature control signal according to a temperature variation of a temperature control circuit.
Figure 10:
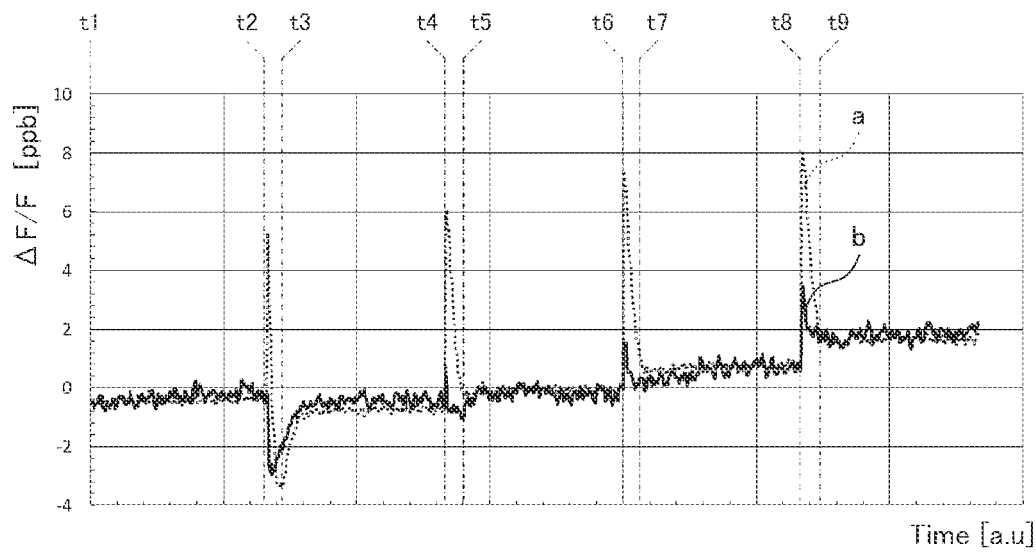
FIG. 10 is a diagram showing an example of a frequency deviation (ΔF/F) of an oscillation clock signal according to the temperature control signal shown in FIG. 9.

Here, a specific example of an action and effect in the first embodiment will be described with reference to FIGS. 9 and 10. FIG. 9 is a diagram showing an example of a time variation occurring in a voltage value of the temperature control signal VHC according to the temperature variation of the temperature adjustment circuit 110. FIG. 10 is a diagram showing an example of a frequency deviation (ΔF/F) of the oscillation clock signal CKO according to the temperature control signal VHC shown in FIG. 9. In FIG. 10, the frequency deviation (ΔF/F) of the oscillation clock signal CKO when the frequency correction circuit 222 does not have a configuration for compensating for the frequency variation of the oscillation clock signal CKO based on the time change amount of the temperature control signal VHC above is shown by a broken line a, and the frequency deviation (ΔF/F) of the oscillation clock signal CKO when the frequency correction circuit 222 has a configuration for compensating for the frequency variation of the oscillation clock signal CKO based on the time change amount of the temperature control signal VHC above is shown by a solid line b. Each of time points t1 to t9 shown in FIG. 9 and time points t1 to t9 shown in FIG. 10 indicate time points corresponding to each other. That is, the time point t1 shown in FIG. 9 and the time point t1 shown in FIG. 10 are substantially the same timing.

In the example shown in FIG. 9, from the time point t1 to the time point t2, the temperature control circuit 245 outputs the temperature control signal VHC having a substantially constant voltage value. That is, in a period from the time point t1 to the time point t2, the temperature of the temperature adjustment circuit 110 is kept substantially constant. Therefore, as shown in FIG. 10, the frequency deviation of the oscillation clock signal CKO is kept substantially constant in the period from the time point t1 to the time point t2.

In a period from the time point t2 to the time point t3 shown in FIGS. 9 and 10, the temperature of the temperature adjustment circuit 110 varies in a short time due to an external cause or an internal cause of the oscillator 1. Accordingly, the temperature control circuit 245 outputs the temperature control signal VHC for keeping the temperature of the temperature adjustment circuit 110 substantially constant. Specifically, when the temperature of the temperature adjustment circuit 110 varies in a short time in the period from the time point t2 to the time point t3, the temperature control circuit 245 outputs, as shown in the example of FIG. 9, the temperature control signal VHC for compensating for the temperature variation only for a short time in the period from the time point t2 to the time point t3. Such a short-time temperature variation of the temperature adjustment circuit 110 is caused by, for example, a change in a setting of the oscillator 1 or a variation in the voltage value of the power supply voltage VDD supplied to the temperature adjustment circuit 110.

In a case where a short-time temperature variation occurs in the temperature adjustment circuit 110 in the period from the time point t2 to the time point t3, when the frequency correction circuit 222 does not have the configuration for compensating for the frequency variation of the oscillation clock signal CKO based on the time change amount of the temperature control signal VHC as shown by the broken line a in FIG. 10, the oscillation frequency of the resonator 2 varies according to the transient temperature variation of the temperature adjustment circuit 110, and as a result, the frequency deviation of the oscillation clock signal CKO output from the oscillator 1 deteriorates.

In contrast, when the frequency correction circuit 222 has the configuration for compensating for the frequency variation of the oscillation clock signal CKO based on the time change amount of the temperature control signal VHC shown in the first embodiment as shown by the solid line b of FIG. 10, the variation in the oscillation frequency of the resonator 2 according to the transient temperature variation of the temperature adjustment circuit 110 is reduced, and as a result, a possibility of deterioration of the frequency deviation of the oscillation clock signal CKO output from the oscillator 1 is reduced.

Since a period from the time point t3 to the time point t4, a period from the time point t5 to the time point t6, and a period from the time point t7 to the time point t8 shown in FIGS. 9 and 10 are all similar as the period from the time point t1 to the time point t2 above, and a period from the time point t4 to the time point t5, a period from the time point t6 to the time point t7, and a period from the time point t8 to the time point t9 are all similar as the period from the time point t2 to the time point t3 above, a detailed description thereof is omitted.

As described above, in the oscillator 1 in the first embodiment, the frequency correction circuit 222 that corrects the frequency variation of the oscillation clock signal CKO compensates for the frequency variation of the oscillation clock signal CKO based on the time change amount of the temperature control signal VHC for controlling the temperature of the temperature adjustment circuit 110 generated based on the temperature of the temperature adjustment circuit 110 detected by the temperature detection circuit 120, thereby reducing the variation in the frequency of the oscillation clock signal CKO output from the oscillator 1.

In the oscillator 1 of the first embodiment, the temperature detection circuit 120 is positioned closer to the temperature adjustment circuit 110 than the resonator 2 is, and the temperature detection circuit 120 is positioned between the resonator 2 and the temperature adjustment circuit 110. Accordingly, when the transient temperature change occurs in the temperature adjustment circuit 110, it is possible to detect, by the temperature detection circuit 120, whether the transient temperature change occurs in the temperature adjustment circuit 110 before the heat caused by the temperature change is transmitted to the resonator 2. That is, it is possible to shorten a time during which the transient temperature change occurred in the temperature adjustment circuit 110 may affect the frequency of the resonator 2. Therefore, the temperature detection circuit 120 is positioned closer to the temperature adjustment circuit 110 than the resonator 2 is, the temperature detection circuit 120 is positioned between the resonator 2 and the temperature adjustment circuit 110, so that the variation in the frequency of the oscillation clock signal CKO output from the oscillator 1 can be further reduced.

1.6 Modification

In the oscillator 1 of the first embodiment described above, the frequency correction circuit 222 compensates for the transient frequency variation of the oscillation clock signal CKO based on the time change amount of the temperature control signal VHC output by the temperature control circuit 245, but the frequency correction circuit 222 included in the oscillator 1 of a modification compensates for the transient frequency variation of the oscillation clock signal CKO based on a time change amount of the first temperature detection signal VT1 output by the temperature detection circuit 120.

Figure 11:
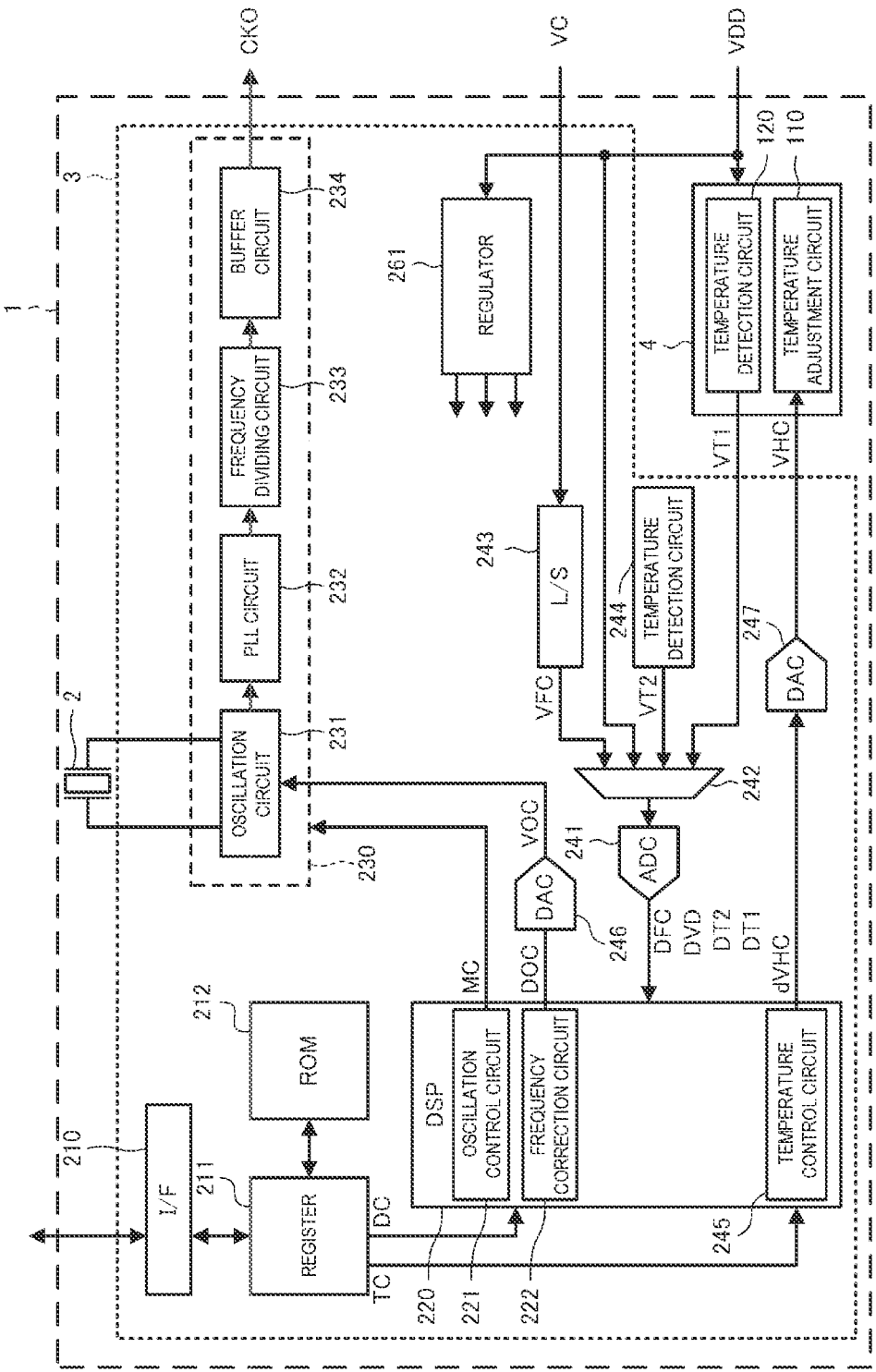
FIG. 11 is a functional block diagram showing an electrical configuration of a modification of the oscillator.

A modification of the oscillator 1 will be described with reference to FIGS. 11 and 12. FIG. 11 is a functional block diagram showing an electrical configuration of the modification of the oscillator 1.

As shown in FIG. 11, in the modification of the oscillator 1, the frequency control signal VFC generated by the level shifter 243, the first temperature detection signal VT1 generated by the temperature detection circuit 120, the second temperature detection signal VT2 generated by the temperature detection circuit 244, and the power supply voltage VDD supplied to the oscillator 1 are input to the selector 242. Then, the selector 242 selects and outputs any one of the frequency control signal VFC, the first temperature detection signal VT1, the second temperature detection signal VT2, and the power supply voltage VDD. The selector 242 selects and outputs the frequency control signal VFC, the first temperature detection signal VT1, the second temperature detection signal VT2, and the power supply voltage VDD in the time division.

The A/D converter 241 converts each of the frequency control signal VFC, the first temperature detection signal VT1, the second temperature detection signal VT2, and the power supply voltage VDD output from the selector 242 in the time division into the frequency control code DFC, a first temperature detection code DT1, the second temperature detection code DT2, and the power supply voltage code DVD, which are digital signals in sequence.

At least the first temperature detection code DT1 and the second temperature detection code DT2 in the frequency control code DFC, the first temperature detection code DT1, the second temperature detection code DT2, and power supply voltage code DVD converted by the A/D converter 241 are input to the frequency correction circuit 222 included in the digital signal processor 220.

Figure 12:
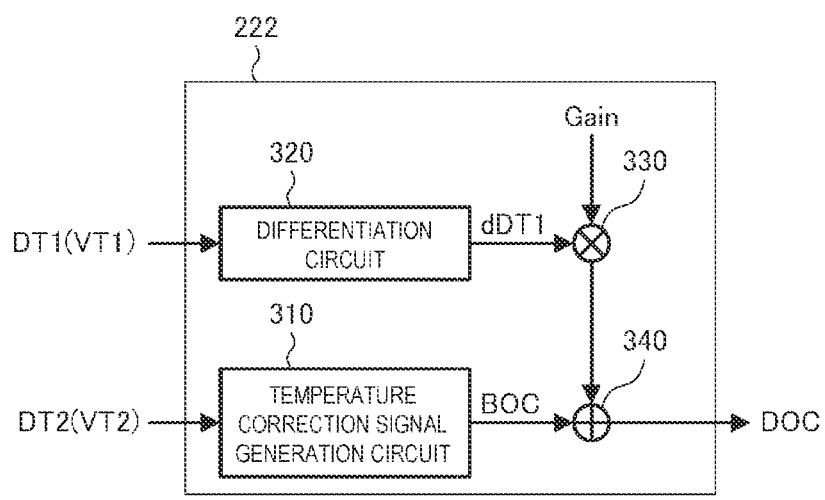
FIG. 12 is a diagram showing an example of a configuration of the frequency correction circuit included in the modification of the oscillator.

FIG. 12 is a diagram showing an example of a configuration of the frequency correction circuit 222 included in the modification of the oscillator 1. As shown in FIG. 12, the frequency correction circuit 222 included in the modification of the oscillator 1 includes the correction signal generation circuit 310, the differentiation circuit 320, the multiplier 330, and the adder 340. The correction signal generation circuit 310 is similar as the correction signal generation circuit 310 described with reference to FIG. 8, and a description thereof is omitted.

The first temperature detection code DT1 according to the first temperature detection signal VT1 generated by the temperature detection circuit 120 is input to the differentiation circuit 320. The differentiation circuit 320 outputs a differential first temperature detection code dDT1 indicating a time conversion amount of the first temperature detection code DT1.

Here, as described above, the first temperature detection signal VT1 is a signal according to the temperature of the temperature adjustment circuit 110 detected by the temperature detection circuit 120, and changes in conjunction with the temperature change of the temperature adjustment circuit 110. Therefore, the differential first temperature detection code dDT1 output from the differentiation circuit 320 is a signal indicating the time change amount of the temperature of the temperature adjustment circuit 110. That is, when a transient temperature change occurs in the temperature adjustment circuit 110, the differentiation circuit 320 outputs the differential first temperature detection code dDT1.

Then, the multiplier 330 multiplies the differential first temperature detection code dDT1 output from the differentiation circuit 320 by the predetermined gain Gain, and then the adder 340 adds a signal obtained by multiplying the differential first temperature detection code dDT1 by the predetermined gain Gain and the base frequency correction code BOC output from the correction signal generation circuit 310, thereby outputting the frequency correction code DOC.

As described above, in the modification of the oscillator 1, the frequency correction circuit 222 that corrects the frequency variation of the oscillation clock signal CKO compensates for the frequency variation of the oscillation clock signal CKO based on the time change amount of the first temperature detection signal VT1 detected by the temperature detection circuit 120 according to the temperature of the temperature adjustment circuit 110. That is, the frequency correction circuit 222 corrects the frequency variation of the oscillation clock signal CKO based on the temperature change of the temperature adjustment circuit 110 that heats the resonator 2. Therefore, similar action and effect as those of the oscillator 1 in the first embodiment above can be obtained.

In the oscillator 1 according to the first embodiment described above, the PLL circuit 232 included in the oscillation clock signal output circuit 230 may be a so-called fractional N phase locked loop (PLL) circuit that converts the frequency of the oscillation signal output from the oscillation circuit 231 into a frequency according to a division ratio instructed by a delta-sigma modulated division ratio control signal. In this case, the frequency correction circuit 222 may generate the frequency correction code DOC for determining the division ratio of the fractional N-PLL circuit as a signal for correcting the frequency of the oscillation clock signal CKO, and supply the generated frequency correction code DOC to the fractional N-PLL circuit without passing through the D/A converter 246. Even in the modification of the oscillator 1 configured as described above, the similar action and effect as those of the oscillator 1 in the first embodiment above can be obtained.

2. Second Embodiment

Next, the oscillator 1 according to a second embodiment will be described. The oscillator 1 of the second embodiment is different from the oscillator 1 of the first embodiment in that the frequency correction circuit 222 compensates for the transient frequency variation of the oscillation clock signal CKO based on a time change amount of the power supply voltage VDD supplied to the oscillator 1 and the second circuit device 4. In describing the oscillator 1 in the second embodiment, the similar components as those of the oscillator 1 of the first embodiment are denoted by the same reference signs, and a description thereof is simplified or omitted.

Figure 13:
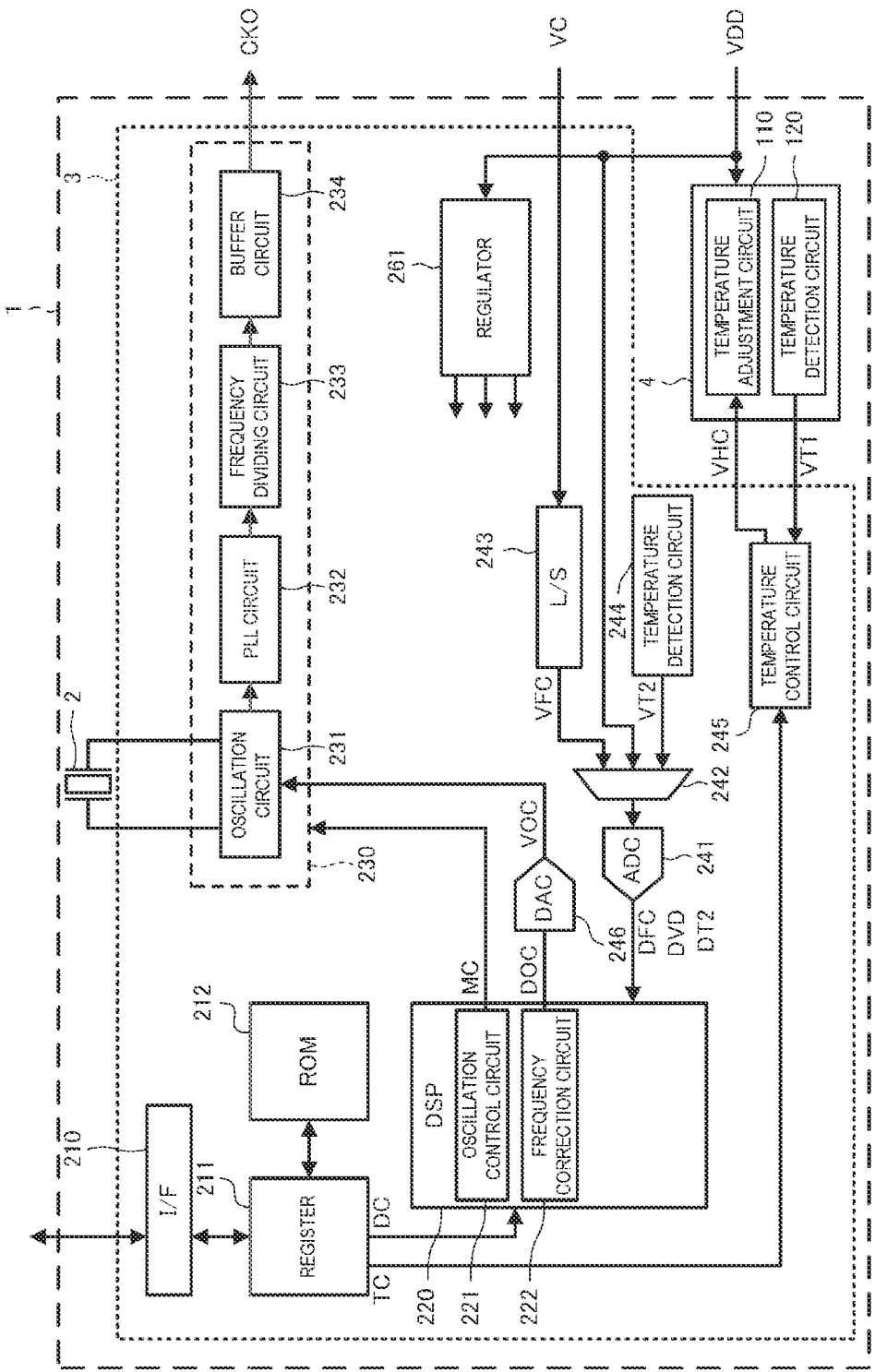
FIG. 13 is a functional block diagram showing an electrical configuration of the oscillator according to a second embodiment.

FIG. 13 is a functional block diagram showing an electrical configuration of the oscillator 1 according to the second embodiment. As shown in FIG. 13, in the oscillator 1 of the second embodiment, the frequency control signal VFC generated by the level shifter 243, the second temperature detection signal VT2 generated by the temperature detection circuit 244, and the power supply voltage VDD supplied to the oscillator 1 are input to the selector 242. Then, the selector 242 selects and outputs any one of the frequency control signal VFC, the second temperature detection signal VT2, and the power supply voltage VDD. Similarly to the oscillator 1 of the first embodiment, the selector 242 selects and outputs the frequency control signal VFC, the second temperature detection signal VT2, and the power supply voltage VDD in the time division.

The A/D converter 241 converts each of the frequency control signal VFC, the second temperature detection signal VT2, and the power supply voltage VDD output from the selector 242 in the time division into the frequency control code DFC, the second temperature detection code DT2, and the power supply voltage code DVD, which are digital signals in sequence.

At least the second temperature detection code DT2 and the power supply voltage code DVD in the frequency control code DFC, the second temperature detection code DT2, and power supply voltage code DVD converted by the A/D converter 241 are input to the frequency correction circuit 222 included in the digital signal processor 220.

Figure 14:
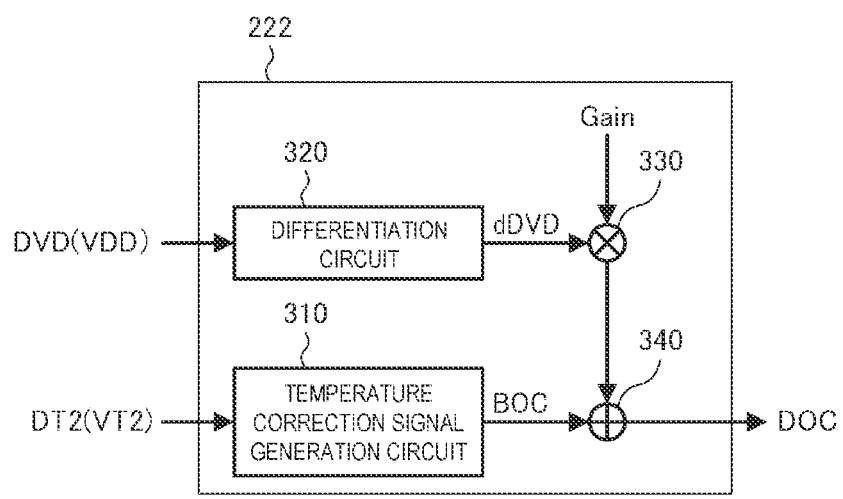
FIG. 14 is a diagram showing an example of a configuration of the frequency correction circuit included in the oscillator according to the second embodiment.

FIG. 14 is a diagram showing an example of a configuration of the frequency correction circuit 222 included in the oscillator 1 according to the second embodiment. As shown in FIG. 14, the frequency correction circuit 222 included in the oscillator 1 of the second embodiment includes the correction signal generation circuit 310, the differentiation circuit 320, the multiplier 330, and the adder 340. The correction signal generation circuit 310 has similar configuration as that of the first embodiment, and a description thereof is omitted.

The power supply voltage code DVD according to the power supply voltage VDD, which is a power supply of the oscillator 1 and the second circuit device 4, is input to the differentiation circuit 320. The differentiation circuit 320 outputs a differential power supply voltage code dDVD indicating a time conversion amount of the power supply voltage code DVD.

Here, the second circuit device 4 has similar configuration as that of FIG. 6 described above. When the power supply voltage VDD supplied to the second circuit device 4 configured thus changes in a short time, the current flowing through the resistor 111 included in the temperature adjustment circuit 110 changes in a short time. As a result, a temperature of the resistor 111 changes in a short time. That is, it can be said that the temperature change of the temperature adjustment circuit 110 in a short time is caused according to a change of the power supply voltage VDD in a short time.

The frequency correction circuit 222 included in the oscillator 1 in the second embodiment detects a transient temperature change of the temperature adjustment circuit 110 based on the power supply voltage VDD, which is a signal according to such temperature variation of the temperature adjustment circuit 110, and compensates for a transient frequency variation of the oscillation clock signal CKO output from the oscillator 1 based on the temperature change. Accordingly, similar action and effect as those of the oscillator 1 in the first embodiment can be obtained.

Further, in the case of the temperature adjustment circuit 110 having the configuration shown in FIG. 6, when the voltage value of the supplied power supply voltage VDD varies, the current flowing through the resistor 111 varies, and as a result, the temperature of the temperature adjustment circuit 110 may change. That is, the temperature of the temperature adjustment circuit 110 varies according to the voltage value of the power supply voltage VDD.

In the oscillator 1 of the second embodiment, by detecting a time change amount of the voltage value of the power supply voltage VDD, it is possible to detect in advance whether the temperature of the temperature adjustment circuit 110 may vary. As a result, a time difference from the occurrence of a short-time temperature variation in the temperature adjustment circuit 110 to the compensation for the transient frequency variation of the oscillation clock signal CKO in the frequency correction circuit 222 can be reduced, and variation of the frequency of the oscillation clock signal CKO output from the oscillator 1 can be further reduced.

3. Third Embodiment

Next, the oscillator 1 according to a third embodiment will be described with reference to FIGS. 15 and 16. In the oscillator 1 according to the third embodiment, the digital signal processor 220 includes a trigger circuit 223 that outputs a trigger signal TRG, and the oscillator 1 of the third embodiment is different from the oscillator 1 of the first and second embodiments in that the frequency correction circuit 222 switches whether to compensate for the transient frequency variation of the oscillation clock signal CKO based on the trigger signal TRG output from the trigger circuit 223. In describing the oscillator 1 in the third embodiment, the similar components as those of the oscillator 1 of the first and second embodiments are denoted by the same reference signs, and a description thereof is simplified or omitted.

Figure 15:
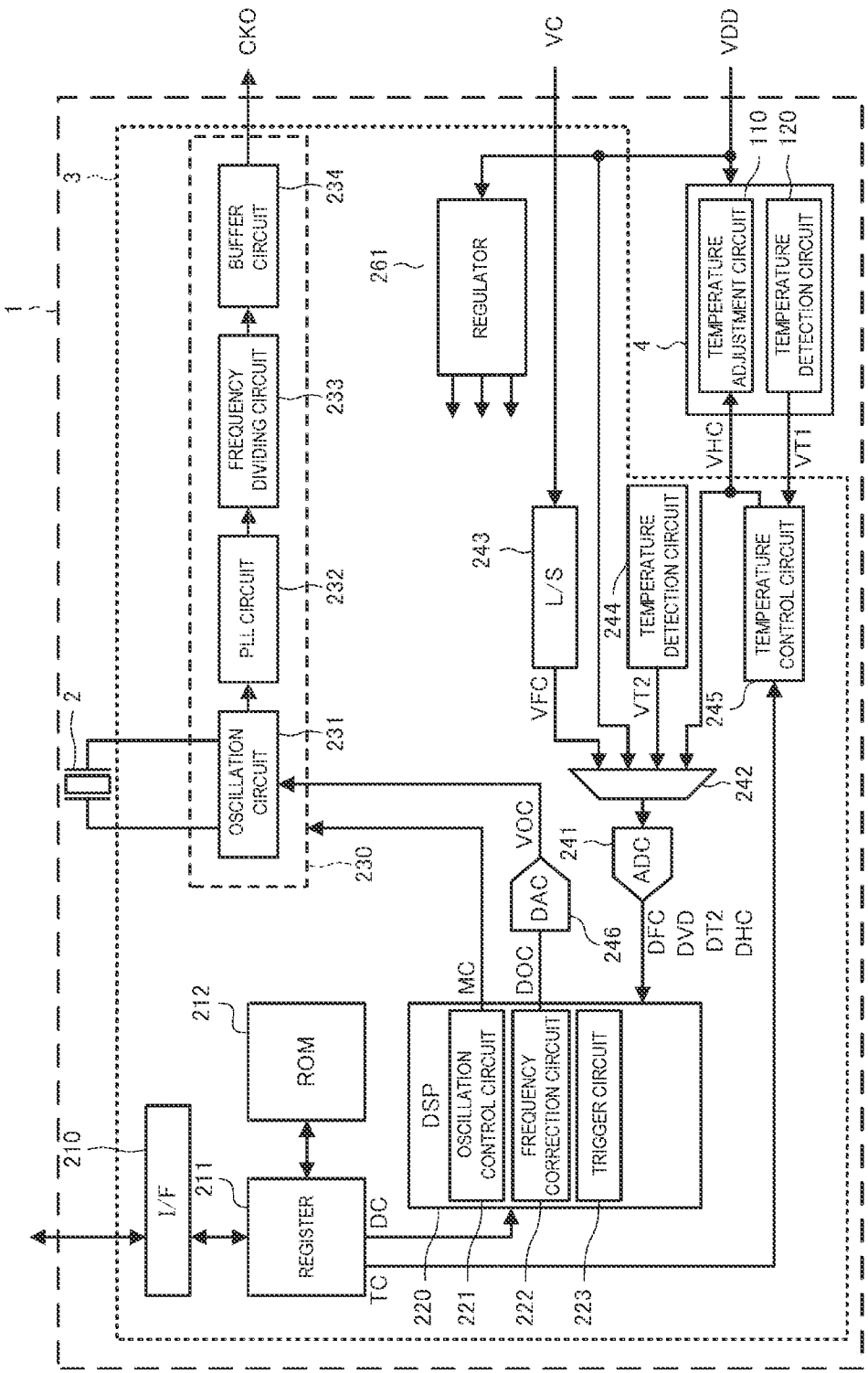
FIG. 15 is a functional block diagram showing an electrical configuration of the oscillator according to a third embodiment.

FIG. 15 is a functional block diagram showing an electrical configuration of the oscillator 1 according to the third embodiment. As shown in FIG. 15, the digital signal processor 220 included in the oscillator 1 of the third embodiment includes the trigger circuit 223 in addition to the oscillation control circuit 221 and the frequency correction circuit 222. The trigger circuit 223 is an example of the trigger signal output circuit.

Figure 16:
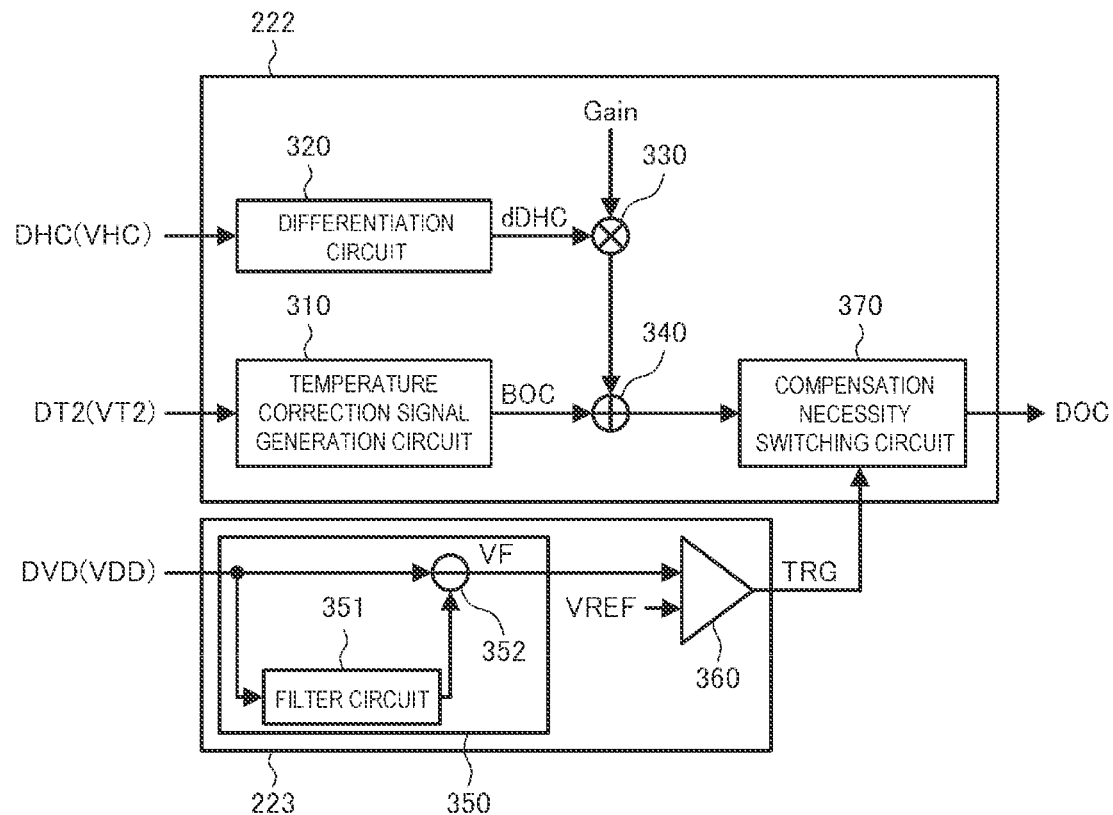
FIG. 16 is a diagram showing an example of configurations of the frequency correction circuit and a trigger circuit according to the third embodiment.

FIG. 16 is a diagram showing an example of configurations of the frequency correction circuit 222 and the trigger circuit 223 according to the third embodiment. The frequency correction circuit 222 includes the correction signal generation circuit 310, the differentiation circuit 320, the multiplier 330, the adder 340, and a compensation necessity switching circuit 370. The correction signal generation circuit 310, the differentiation circuit 320, the multiplier 330, and the adder 340 are similar as those of the oscillator 1 of the first embodiment, and a description thereof is omitted.

The compensation necessity switching circuit 370 receives the frequency correction code DOC output from the adder 340 and the trigger signal TRG output from the trigger circuit 223. Then, according to the trigger signal TRG, the trigger circuit 223 switches whether to compensate for the frequency variation caused by the short-time temperature variation of the temperature adjustment circuit 110 with respect to the oscillation clock signal CKO.

The trigger circuit 223 includes a power supply voltage detection circuit 350 and a comparison circuit 360. The power supply voltage code DVD according to the power supply voltage VDD supplied to the temperature adjustment circuit 110 is input to the power supply voltage detection circuit 350. The power supply voltage detection circuit 350 detects the change amount in the power supply voltage VDD based on the power supply voltage code DVD according to the power supply voltage VDD, and outputs a power supply variation signal VF according to the change amount.

Specifically, the power supply voltage detection circuit 350 includes a filter circuit 351 and a subtractor 352. The power supply voltage code DVD input to the power supply voltage detection circuit 350 is branched in the power supply voltage detection circuit 350, one power supply voltage code DVD is input to the subtractor 352, and the other power supply voltage code DVD is input to the filter circuit 351.

The filter circuit 351 includes a moving average filter (not shown). Then, a signal indicating a moving average of the input power supply voltage code DVD is input to the subtractor 352. Here, the filter circuit 351 may be, for example, a low-pass filter circuit as long as the filter circuit 351 can remove a variation in the voltage value in a short time occurred in the power supply voltage VDD according to the power supply voltage code DVD.

The subtractor 352 outputs a difference between the power supply voltage code DVD and a signal indicating the moving average of the power supply voltage code DVD as the power supply variation signal VF from the power supply voltage detection circuit 350.

A threshold code VREF according to a reference voltage Vref indicating a predetermined threshold voltage and the power supply variation signal VF output from the power supply voltage detection circuit 350 are input to the comparison circuit 360. When the power supply variation signal VF is larger than the threshold code VREF, that is, when the change amount in the voltage value of the power supply voltage VDD is equal to or greater than a predetermined threshold value, the comparison circuit 360 outputs the trigger signal TRG for compensating for the frequency variation of the oscillation clock signal CKO in the frequency correction circuit 222, and when the power supply variation signal VF is smaller than the threshold code VREF, that is, when the change amount in the voltage value of the power supply voltage VDD is less than the predetermined threshold value, the comparison circuit 360 outputs the trigger signal TRG for stopping the compensation for the frequency variation of the oscillation clock signal CKO in the frequency correction circuit 222.

Here, the threshold code VREF used when the trigger circuit 223 transits from a state of outputting the trigger signal TRG for stopping the compensation for the frequency variation of the oscillation clock signal CKO in the frequency correction circuit 222 to a case without outputting the trigger signal TRG for compensating for the frequency variation of the oscillation clock signal CKO in the frequency correction circuit 222, and the threshold code VREF used when the trigger circuit 223 transits from a state of outputting the trigger signal TRG for compensating for the frequency variation of the oscillation clock signal CKO in the frequency correction circuit 222 to the state of outputting the trigger signal TRG for stopping the compensation for the frequency variation of the oscillation clock signal CKO in the frequency correction circuit 222, may be different values.

In the oscillator 1, one of the causes that increase a possibility of the transient frequency variation in the oscillation clock signal CKO is the transient variation in the voltage value of the power supply voltage VDD supplied to the temperature adjustment circuit 110. In the oscillator 1 of the third embodiment, a variation in the voltage value of the power supply voltage VDD is detected, and when the possibility of the transient frequency variation in the oscillation clock signal CKO output by the oscillator 1 is high, the transient frequency variation of the oscillation clock signal CKO is compensated, and when the possibility of the transient frequency variation in the oscillation clock signal CKO is low, the compensation for the transient frequency variation of the oscillation clock signal CKO is stopped. Accordingly, as compared with a case where the transient frequency variation in the oscillation clock signal CKO is always guaranteed, it is possible to reduce power consumption of the oscillator 1, and further reduce a possibility that noise or the like caused by an operation of the differentiation circuit 320 or the like contributes to the oscillation clock signal CKO. That is, in the oscillator 1 according to the third embodiment, in addition to the action and effect of the oscillator 1 in the first and second embodiments, it is possible to reduce the power consumption of the oscillator 1 and further improve frequency control of the oscillation clock signal CKO.

4. Fourth Embodiment

Figure 17:
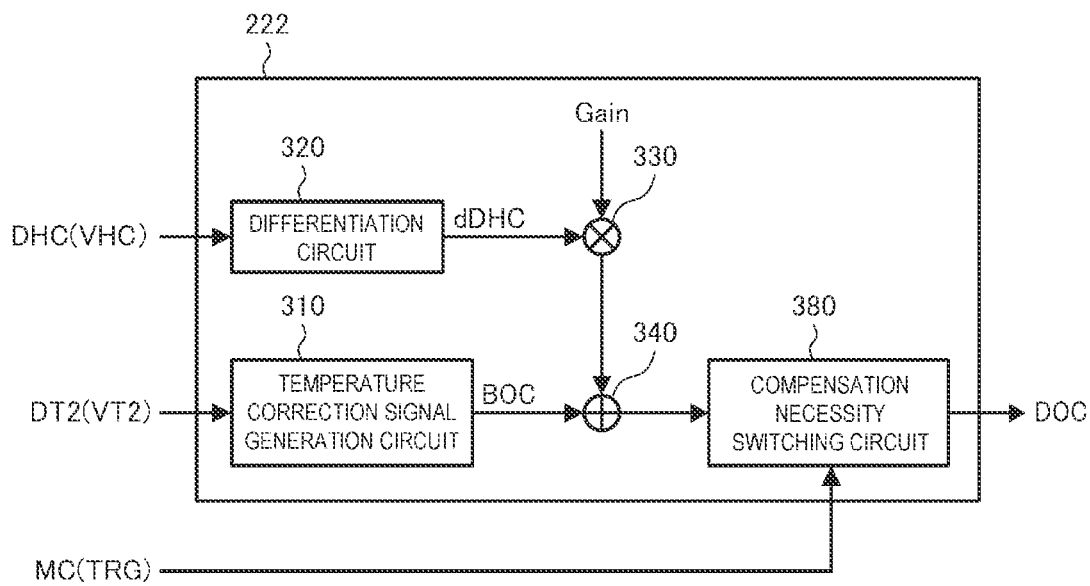
FIG. 17 is a diagram showing an example of the configuration of the frequency correction circuit according to the third embodiment.

Next, the oscillator 1 according to a fourth embodiment will be described with reference to FIG. 17. FIG. 17 is a diagram showing an example of the configuration of the frequency correction circuit 222 according to the third embodiment. The oscillator 1 in the fourth embodiment differs from the oscillator 1 in the third embodiment in that the necessity of compensation for the frequency variation of the oscillation clock signal CKO is switched based on the oscillation control signal MC as shown in FIG. 17. That is, when the oscillation control circuit 221 outputs the oscillation control signal MC for changing a setting of the oscillation clock signal output circuit 230, the oscillator 1 in the fourth embodiment switches the necessity of compensation for the frequency variation of the oscillation clock signal CKO based on the oscillation control signal MC. That is, the oscillation control signal MC in the oscillator 1 of the fourth embodiment functions as the trigger signal TRG in the oscillator 1 of the third embodiment. In the oscillator 1, one of the causes that increase the possibility of the transient frequency variation in the oscillation clock signal CKO is a change in an operating state of the oscillator 1 due to a change in the setting of the oscillation clock signal output circuit 230. Therefore, even when the necessity of compensation for the frequency variation of the oscillation clock signal CKO is switched based on the oscillation control signal MC, the similar action and effect as those of the oscillator 1 shown in the third embodiment can be obtained.

Although the embodiments and modifications are described above, the present disclosure is not limited to these embodiments, and can be implemented in various aspects without departing from the gist thereof. For example, the above embodiments may be combined as appropriate.

The present disclosure includes a configuration substantially the same as the configuration described in the embodiments (for example, a configuration having the same function, method and result, or a configuration having the same purpose and effect). The present disclosure includes a configuration in which a non-essential portion of the configuration described in the embodiment is replaced. In addition, the present disclosure includes a configuration having the same action and effect as the configuration described in the embodiment, or a configuration capable of achieving the same object. The present disclosure includes a configuration in which a known technique is added to the configuration described in the embodiment.

The following contents are derived from the above embodiments and modifications.

An oscillator according to one aspect includes: a resonator; a heat generation circuit configured to heat the resonator; a temperature sensor positioned closer to the heat generation circuit than the resonator is and configured to output a temperature detection signal; a temperature control circuit configured to output a temperature control signal for controlling a temperature of the heat generation circuit based on the temperature detection signal; an oscillation clock signal output circuit configured to oscillate the resonator and output an oscillation clock signal; and a correction circuit configured to correct a frequency variation of the oscillation clock signal, in which the correction circuit is configured to compensates for a transient frequency variation of the oscillation clock signal based on a time change amount of the temperature detection signal or a time change amount of the temperature control signal.

According to the oscillator, the correction circuit compensates for the transient frequency variation of the oscillation clock signal based on the time change amount of the temperature control signal for controlling the temperature of the heat generation circuit that heats the resonator or the temperature detection signal output by the temperature sensor that is positioned close to the heat generation circuit that heats the resonator and outputs the temperature detection signal. Here, the temperature control signal is a signal for controlling the temperature of the heat generation circuit that heats the resonator, and the temperature detection signal is a signal including a temperature of the resonator detected by the temperature sensor. That is, the temperature control signal and the temperature detection signal are signals according to the temperature of the heat generation circuit. By compensating for the transient frequency variation of the oscillation clock signal based on the signal according to the temperature of such heat generation circuit, it is possible to reduce a possibility that the frequency variation occurs in the signal output from the oscillator even when a short-term variation occurs in a temperature of a heater due to various causes applied to the oscillator 1.

An oscillator according to one aspect includes: a resonator; a heat generation circuit configured to heat the resonator; a temperature sensor positioned closer to the heat generation circuit than the resonator is and configured to output a temperature detection signal; a temperature control circuit configured to output a temperature control signal for controlling a temperature of the heat generation circuit based on the temperature detection signal; an oscillation clock signal output circuit configured to oscillate the resonator and output an oscillation clock signal; and a correction circuit configured to correct a frequency variation of the oscillation clock signal, in which the correction circuit is configured to compensate for a transient frequency variation of the oscillation clock signal based on a time change amount of a power supply voltage supplied to the heat generation circuit.

According to the oscillator, the correction circuit compensates for the transient frequency variation of the oscillation clock signal based on the time change amount of the power supply voltage supplied to the heat generation circuit that heats the resonator. Here, when the power supply voltage supplied to the heat generation circuit changes in a short time, a current flowing through the heat generation circuit changes in a short time. As a result, the temperature of the heat generation circuit changes in a short time. That is, a temperature change of the heat generation circuit is caused according to the change of the power supply voltage in a short time. By compensating for the transient frequency variation of the oscillation clock signal based on the change amount in the power supply voltage supplied to such heat generation circuit in a short time, it is possible to reduce a possibility that the frequency variation occurs in the signal output from the oscillator even when a short-term variation occurs in a temperature of a heater applied to the oscillator 1.

The oscillator according to one aspect may further include: a trigger signal output circuit configured to output a trigger signal, in which the correction circuit may compensate for the frequency variation of the oscillation clock signal based on the trigger signal.

According to the oscillator, since it is possible to control whether to compensate for the frequency variation of the oscillation clock signal based on the trigger signal, it is possible to stop the compensation for the frequency variation of the oscillation clock signal at a timing that does not require the compensation for the frequency variation of the oscillation clock signal. Therefore, it is possible to reduce power consumption of the oscillator caused by the compensation for the frequency variation of the oscillation clock signal, and reduce the possibility that noise caused by the compensation for the frequency variation of the oscillation clock signal contributes to the other circuits forming the oscillator. Therefore, it is possible to further reduce the possibility that the frequency variation occurs in the signal output from the oscillator.

In the oscillator according to one aspect, the trigger signal output circuit may output the trigger signal for compensating for the frequency variation of the oscillation clock signal when a change amount in a power supply voltage supplied to the heat generation circuit is equal to or greater than a predetermined value.

In the oscillator according to one aspect, the correction circuit may include a compensation necessity switching circuit to which the trigger signal is to be input, the trigger signal output circuit may include a power supply voltage detection circuit configured to output a power supply variation signal according to a change amount of a power supply voltage supplied to the heat generation circuit, and a comparison circuit configured to compare a width of a change amount of a voltage value of the power supply voltage indicated by the power supply variation signal with a predetermined threshold value, and output the trigger signal according to a comparison result, and the compensation necessity switching circuit may switch whether to compensate for the frequency variation of the oscillation clock signal according to the trigger signal.

The oscillator according to one aspect may further include: a control circuit configured to control an operation of the oscillation clock signal output circuit, in which the correction circuit may switch whether to compensate for the frequency variation of the oscillation clock signal based on a setting change signal output when the control circuit changes a setting of the oscillation clock signal output circuit.

The oscillator according to one aspect may further include: a first integrated circuit including the heat generation circuit and the temperature sensor.

In the oscillator according to one aspect, the heat generation circuit and the temperature sensor may be disposed in a state of being stacked in the first integrated circuit, the resonator may be positioned above the first integrated circuit in a direction in which the heat generation circuit and the temperature sensor are stacked, and in the first integrated circuit, the temperature sensor may be positioned above the heat generation circuit.

According to the oscillator, since the temperature sensor is positioned between the heat generation circuit and the resonator, the temperature sensor can detect the temperature variation before heat occurred by an unintended temperature variation of the heat generation circuit is transmitted to the resonator. Therefore, it is possible to shorten a time to which an unintended temperature is applied to the resonator, and as a result, it is possible to further reduce the possibility that the frequency variation occurs in the signal output from the oscillator.

The oscillator according to one aspect may further include: a second integrated circuit including the oscillation clock signal output circuit and the correction circuit, in which the temperature sensor may be positioned closer to the resonator than the second integrated circuit is.

According to the oscillator, the first integrated circuit including the heat generation circuit and the temperature sensor is positioned closer to the resonator than the second integrated circuit including the oscillation clock signal output circuit and the correction circuit is, thereby improving accuracy of temperature control of the resonator by the first integrated circuit. Therefore, it is possible to reduce the possibility that the temperature variation occurs in the resonator, and as a result, it is possible to further reduce the possibility that the frequency variation occurs in the signal output from the oscillator.

What is claimed is:

1. An oscillator comprising:
a resonator;
a heat generation circuit configured to heat the resonator;
a temperature sensor positioned closer to the heat generation circuit than the resonator is and configured to output a temperature detection signal;
a temperature control circuit configured to output a temperature control signal for controlling a temperature of the heat generation circuit based on the temperature detection signal;
an oscillation clock signal output circuit configured to oscillate the resonator and output an oscillation clock signal; and
a correction circuit configured to correct a frequency variation of the oscillation clock signal, wherein
the correction circuit is configured to compensate for a transient frequency variation of the oscillation clock signal based on a time change amount of the temperature detection signal or a time change amount of the temperature control signal.

2. An oscillator comprising:
a resonator;
a heat generation circuit configured to heat the resonator;
a temperature sensor positioned closer to the heat generation circuit than the resonator is and configured to output a temperature detection signal;
a temperature control circuit configured to output a temperature control signal for controlling a temperature of the heat generation circuit based on the temperature detection signal;
an oscillation clock signal output circuit configured to oscillate the resonator and output an oscillation clock signal; and
a correction circuit configured to correct a frequency variation of the oscillation clock signal, wherein
the correction circuit is configured to compensate for a transient frequency variation of the oscillation clock signal based on a time change amount of a power supply voltage supplied to the heat generation circuit.

3. The oscillator according to claim 1 further comprising:
a trigger signal output circuit configured to output a trigger signal, wherein
the correction circuit is configured to compensate for the frequency variation of the oscillation clock signal based on the trigger signal.

4. The oscillator according to claim 3, wherein
the trigger signal output circuit is configured to output the trigger signal for compensating for the frequency variation of the oscillation clock signal when a change amount in a power supply voltage supplied to the heat generation circuit is equal to or greater than a predetermined value.

5. The oscillator according to claim 3, wherein
the correction circuit includes a compensation necessity switching circuit to which the trigger signal is to be input,
the trigger signal output circuit includes
a power supply voltage detection circuit configured to output a power supply variation signal according to a change amount of a power supply voltage supplied to the heat generation circuit, and a comparison circuit configured to compare a width of a change amount of a voltage value of the power supply voltage indicated by the power supply variation signal with a predetermined threshold value, and output the trigger signal according to a comparison result, and the compensation necessity switching circuit is configured to switch whether to compensate for the frequency variation of the oscillation clock signal according to the trigger signal.

6. The oscillator according to claim 1 further comprising:
a control circuit configured to control an operation of the oscillation clock signal output circuit, wherein
the correction circuit is configured to switch whether to compensate for the frequency variation of the oscillation clock signal based on a setting change signal output when the control circuit changes a setting of the oscillation clock signal output circuit.

7. The oscillator according to claim 1 further comprising:
a first integrated circuit including the heat generation circuit and the temperature sensor.

8. The oscillator according to claim 7, wherein
the heat generation circuit and the temperature sensor are disposed in a state of being stacked in the first integrated circuit,
the resonator is positioned above the first integrated circuit in a direction in which the heat generation circuit and the temperature sensor are stacked, and
in the first integrated circuit, the temperature sensor is positioned above the heat generation circuit.

9. The oscillator according to claim 7 further comprising:
a second integrated circuit including the oscillation clock signal output circuit and the correction circuit, wherein
the first integrated circuit is positioned closer to the resonator than the second integrated circuit is.

* * * * *